United States Patent [19]
Nishida

[11] Patent Number: 6,014,965
[45] Date of Patent: Jan. 18, 2000

[54] APPARATUS FOR RECOGNIZING THE SHAPE OF A SEMICONDUCTOR WAFER

[75] Inventor: Tetsuro Nishida, Mitaka, Japan

[73] Assignee: Tokyo Seimitsu Co., Ltd., Tokyo, Japan

[21] Appl. No.: 09/110,440

[22] Filed: Jul. 6, 1998

Related U.S. Application Data

[62] Division of application No. 08/865,685, Jun. 2, 1997, abandoned, which is a continuation of application No. 08/674,987, Jul. 3, 1996, abandoned, which is a continuation of application No. 08/261,917, Jun. 16, 1994, abandoned.

[30] Foreign Application Priority Data

Aug. 19, 1993 [JP] Japan .................................. 5-205257

[51] Int. Cl.⁷ ........................................................ B28D 1/04
[52] U.S. Cl. .............................. 125/12; 125/13.01; 451/5; 451/6
[58] Field of Search .................................. 451/5, 6, 8, 9, 451/10, 28, 41, 158, 177; 125/12, 13.01, 15, 16.01, 20

[56] References Cited

U.S. PATENT DOCUMENTS

| | | | |
|---|---|---|---|
| 4,233,625 | 11/1980 | Altman | 358/101 |
| 4,301,470 | 11/1981 | Pagany | 358/101 |
| 4,328,553 | 5/1982 | Fredriksen et al. | 364/559 |
| 4,628,531 | 12/1986 | Okamoto et al. | 382/8 |
| 4,756,968 | 7/1988 | Ebe et al. | 428/343 |
| 5,012,523 | 4/1991 | Kobayashi et al. | 382/8 |
| 5,113,454 | 5/1992 | Marcantonio et al. | 382/27 |
| 5,187,007 | 2/1993 | Ebe et al. | 428/343 |
| 5,255,199 | 10/1993 | Barkman et al. | 364/474 |
| 5,298,989 | 3/1994 | Tsukahara et al. | 348/126 |
| 5,315,666 | 5/1994 | Norton-Wayne | 382/8 |
| 5,331,407 | 7/1994 | Doi et al. | 356/394 |

FOREIGN PATENT DOCUMENTS

| | | |
|---|---|---|
| 288233 A3 | 10/1988 | European Pat. Off. . |
| 490324 A1 | 6/1992 | European Pat. Off. . |
| 57-198642 | 12/1982 | Japan . |
| 58-116748 | 7/1983 | Japan . |
| 3-256341 | 11/1991 | Japan . |
| 4-363047 | 12/1992 | Japan . |
| 5-100413 | 4/1993 | Japan . |

Primary Examiner—David A. Scherbel
Assistant Examiner—Derris Holt Banks
Attorney, Agent, or Firm—Nikaido, Marmelstein, Murray & Oram LLP

[57] ABSTRACT

The present invention provides an apparatus for recognizing the shape of a semiconductor wafer, capable of stably achieving accurate shape recognition without being affected by either a circuit pattern formed on the semiconductor wafer or the color of an adhesive sheet attached to a frame for adhering to the semiconductor wafer. The shape recognizing apparatus for recognizing the shape of a semiconductor wafer in accordance with the present invention comprises an image pickup means for picking up an image of the semiconductor wafer and providing video signals representing the image, the image pickup means being opposite to the semiconductor wafer, and a shape recognizing means for recognizing the shape of the semiconductor wafer by processing the video signals. The shape recognizing apparatus is characterized in that; it comprises an illuminating means for illuminating a semiconductor wafer and transmitting light through the adhesive sheet with the semiconductor wafer, the illuminating means is disposed opposite to the image pickup means, and the semiconductor wafer is interposed between the illuminating means and the image pickup means.

2 Claims, 7 Drawing Sheets

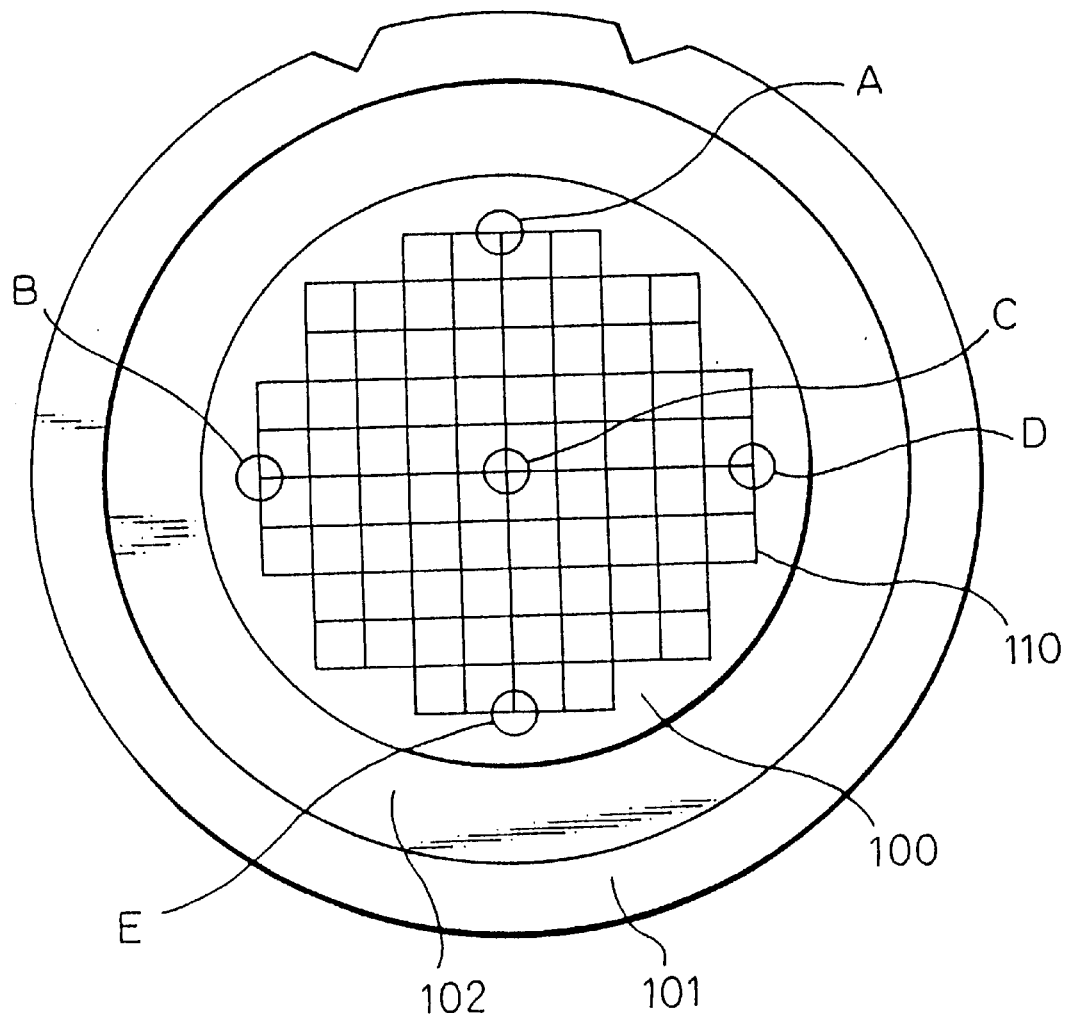

APPARATUS FOR RECOGNIZING THE SHAPE OF A SEMICONDUCTOR WAFER

This application is a divisional application filed under 37 CFR § 1.53(b) of parent application Ser. No. 08/865,685, filed Jun. 2, 1997, now abandoned, which in turn is a application Ser. No. 08/674,987, filed Jul. 3, 1996, now abandoned, which in turn is a continuation of application Ser. No. 08/261,917, filed Jun. 16, 1994, now abandoned.

BACKGROUND OF THE INVENTION (1) Field of the invention

The present invention relates to an apparatus for recognizing the shape of a semiconductor wafer, capable of automatically recognizing the shape of a semiconductor wafer when the semiconductor wafer is being processed on a dicing apparatus or the like so that the dicing apparatus or the like can process and handle the semiconductor wafer accurately and efficiently according to the shape of the semiconductor wafer even if the semiconductor wafer is cracked or chipped.

(2) Description of the Related Art

After fabricating a plurality of semiconductor chips on the surface of a semiconductor wafer, the semiconductor chips are inspected with an IC tester provided with a prober and the semiconductor wafer is diced by a dicing apparatus. In the art of automatically processing the semiconductor wafer, automatization has been developed in order to align the semiconductor wafer automatically and perform various processes on an assumption that the semiconductor wafer is circular. The following explanation will be made in connection with a dicing apparatus by way of example. The dicing apparatus cuts narrow grooves in the surface of the semiconductor wafer with a cutting blade rotating at a high speed, which is widely used for cutting the semiconductor wafer into semiconductor chips.

The pattern of the semiconductor chips fabricated on the surface of the semiconductor wafer cannot be correctly positioned relative to the working position of the cutting blade by simply mounting the semiconductor wafer on the stage and hence the grooves cannot be accurately cut along desired lines on the semiconductor wafer without adjusting the position of the semiconductor wafer relative to the cutting blade. The position of the semiconductor wafer relative to the working position of the cutting blade is adjusted by moving the stage supporting the semiconductor wafer into the field of view of an image pickup device and aligning a specified position on the semiconductor wafer with a specified position in the field of view of a projector. The projector, namely the image pickup device, is located beforehand at a predetermined position relative to the working position of the cutting blade. After thus determining the positional relation between the specified position on the surface of the semiconductor wafer and the working position of the cutting blade, the stage is moved by a precision stage moving mechanism to cut grooves accurately along the desired lines on the semiconductor wafer. The operation to adjust the position of the semiconductor wafer relative to the working position of the cutting blade is called an alignment operation.

When carrying out the alignment operation, for example, an image represented by the video signals provided by the image pickup device such as a video camera is displayed on the screen of a monitor and the operator adjusts the position of the semiconductor wafer while observing the image displayed on the screen of the monitor. Recently, automation of the dicing apparatus has been desired for the enhancement of productivity and an automation of the alignment operation has been realized. The automation of the alignment operation can be achieved by image processing the video signals provided by the image pickup device.

When carrying out automatic alignment through image processing, specific points on the wafer are brought into the field of view of the image pickup device, and the boundaries between the lines and the rows of the semiconductor chips are detected. Then, the inclination and the position of the lines and rows of the semiconductor chips are determined on the basis of the results of detection, the stage is turned so that the lines and rows of the semiconductor chips are aligned with the axes of the moving mechanism, and the coordinates of the moving mechanism in a state where the specified position on the semiconductor wafer coincides with a specified position on the image formed by the image pickup device are stored in a memory. The identification of the lines and the rows of the semiconductor chips using the specific points can be achieved by a known pattern matching method or the like. Accordingly, when the specific points are brought into the field of view of the image pickup device for identification, the identification of the lines and the rows of the semiconductor chips requires a comparatively short time if the specific points are positioned near the center of the field of view of the image pickup device. However, if the specific points are located away from the center of the field of view of the image pickup device, the automatic alignment operation requires a comparatively long time because the operation for pattern matching must be repeated many times.

The semiconductor wafer has a circular or substantially circular shape. Therefore, the specific points are moved for the automatic alignment operation to move the specific points into the field of view of the image pickup device on an assumption that the semiconductor wafer is circular, the semiconductor wafer is supported on the frame with its center substantially on the center of the frame, and the direction of extension of the lines of the semiconductor chips is within a certain range relative to notches formed in the frame. The pattern matching operation is performed after the semiconductor wafer has been thus positioned.

In manufacturing processes, some semiconductor wafers are cracked or chipped, and the semiconductor wafer is not always supported on the frame with its center in coincidence with the center of the frame. The yield rate of the process will be reduced if cracked semiconductor wafers and chipped semiconductor wafers are thrown away. Therefore, defective semiconductor wafers must be diced to provide normal semiconductor chips in order to increase the yield rate. However, when adjusting the position of a cracked semiconductor wafer by an automatic alignment operation, the automatic identification of the lines and rows on the semiconductor chips is impossible because the positions for identifying the lines and rows of the semiconductor chips cannot be determined, and a part of the semiconductor wafer not provided with lines or rows of semiconductor chips may be brought into the field of view. When the center of the semiconductor wafer is located far away from the center of the frame, it is again impossible to identify the lines and rows on the semiconductor chips.

The applicant of the present patent application disclosed a dicing apparatus which starts its operation after recognizing the shape of the semiconductor wafer in Japanese Unexamined Patent Publication (Kokai) No. 4-109652. A dicing apparatus capable of recognizing the shape of the semiconductor wafer by image processing is disclosed in Japanese Unexamined Patent Publication (Kokai) No.

4-233250. In the dicing apparatus mentioned above, an image pickup device is disposed so that specularly reflected light will not fall thereon. Since the surface of the semiconductor wafer is a highly accurate flat plane, most part of the illuminating light falling on the surface of the semiconductor wafer is specularly reflected and little reflected light falls on the image pickup device and hence a region in the image corresponding to the semiconductor wafer is very dark. Although the flatness of the surface of the frame is not as high as that of the surface of the semiconductor wafer, a region in the image corresponding to the frame is somewhat dark because the surface of the frame has a comparatively high flatness. Since the surface of the adhesive sheet reflects the illuminating light irregularly, a region in the image corresponding to the surface of the adhesive sheet is bright. Accordingly, when processing the image to recognize the shape of the semiconductor wafer, the image is converted into a digital image by converting the brightness values of the image into digital values with reference to an appropriate threshold.

Sometimes, the region in the image corresponding to the surface of the semiconductor wafer is brighter than the region of the same corresponding to the surface of the adhesive sheet when the surface of the semiconductor wafer is in a particular condition. In such a case, the image data is inverted so that the images of bright surfaces are dark and the images of dark surfaces are bright, and then, the inverted image data is processed in the foregoing manner to recognize the shape of the semiconductor wafer.

Once the shape of the semiconductor wafer is recognized, the automatic alignment operation becomes possible because the positions of the lines and the rows of the semiconductor chips can be specified, and useless machining time can be dispensed with when dicing the semiconductor wafer because unnecessary parts are also cut although only part of the semiconductor wafer needs to be cut for dicing.

Some circuit patterns formed on the surface of the semiconductor wafer interfere with the perfect specular reflection of the incident illuminating light and causes part of the reflected light to fall on the image pickup device, which is inferred to be due to the diffraction of the light. If such a phenomenon occurs, the image pickup device provides video signals representing a partly bright image of the semiconductor wafer. If such image is digitized using the same threshold as that used for digitizing the image, the semiconductor wafer is recognized as a cracked semiconductor wafer and an accurate recognition of the shape of the semiconductor wafer is impossible.

A warp in the wafer and irregularly finished surface of the wafer are other effects that make accurate shape recognition impossible.

In case the semiconductor wafer is warped or the surface of the semiconductor wafer is not uniform, the shape of the semiconductor wafer cannot be accurately recognized.

Moreover, due to the transmission rate depending on a color of the adhesive sheet, not all of incident illuminating light on the semiconductor wafer is reflected, and the generally incident illuminating light is irregularly reflected and brighter light is received by the image pickup means from some parts of the adhesive sheet because the stage is painted in white. Therefore, depending upon the transmission rate of the color of the adhesive sheet, there is a phenomenon such that irregular reflection occurs in the area where the transmission rate is high and then the image pickup means receives the reflected light, while the irregular reflection does not occur in the area where the transmission rate is low and then the image pickup means does not receive the reflected light.

SUMMARY OF THE INVENTION

The present invention has been made in view of the foregoing problems and it is therefore an object of the present invention to provide a shape recognizing apparatus, for recognizing the shape of a semiconductor wafer, capable of stably and accurately recognizing the shape of a semiconductor wafer without being affected by the circuit pattern formed on the semiconductor wafer, a warp in the semiconductor wafer, the finish on the surface of the semiconductor wafer, or colors of adhesive sheets adhered to the semiconductor wafer.

The shape recognizing apparatus in accordance with the present invention comprises, an image pickup means for picking up an image of the semiconductor wafer and for providing video signals representing the image, the image pickup means being disposed opposite to the semiconductor wafer, and a shape recognizing means for recognizing the shape of the semiconductor wafer by processing said video signals, is characterized in that the shape recognizing apparatus comprises:

an illuminating means for illuminating a semiconductor wafer in a manner to transmit light through an adhesive sheet with the semiconductor wafer, in which the illuminating means is disposed opposite to the image pickup means and the adhesive sheet with the semiconductor wafer is interposed between the illuminating means and the image pickup means.

In the shape recognizing apparatus for recognizing the shape of a semiconductor wafer in accordance with the present invention, the semiconductor wafer is adhered to an adhesive sheet having any color and the adhesive sheet is attached to a frame having central opening to hold the semiconductor wafer in the central opening.

The apparatus for recognizing the shape of a semiconductor wafer according to the present invention performs stable and accurate shape recognition of the semiconductor wafer regardless irregularly finished surface of the semiconductor wafer, or the color of the adhesive sheet, because the semiconductor wafer is interposed between the illuminating means and the shape recognizing means and then the shape is recognized by picking up an image of the semiconductor wafer by transmitting light through the adhesive sheet with the semiconductor wafer in order to obtain fine contrast based on the existence of the semiconductor wafer thereby picking up the image of the accurate shape of the semiconductor wafer.

BRIEF DESCRIPTION OF THE DRAWINGS

The present invention will be more clearly understood from the description as set forth below with reference to the accompanying drawings, wherein:

FIG. 2 is a plan view of a semiconductor wafer showing pattern recognition positions for automatic alignment;

DESCRIPTION OF THE PREFERRED EMBODIMENTS

Figure 1:
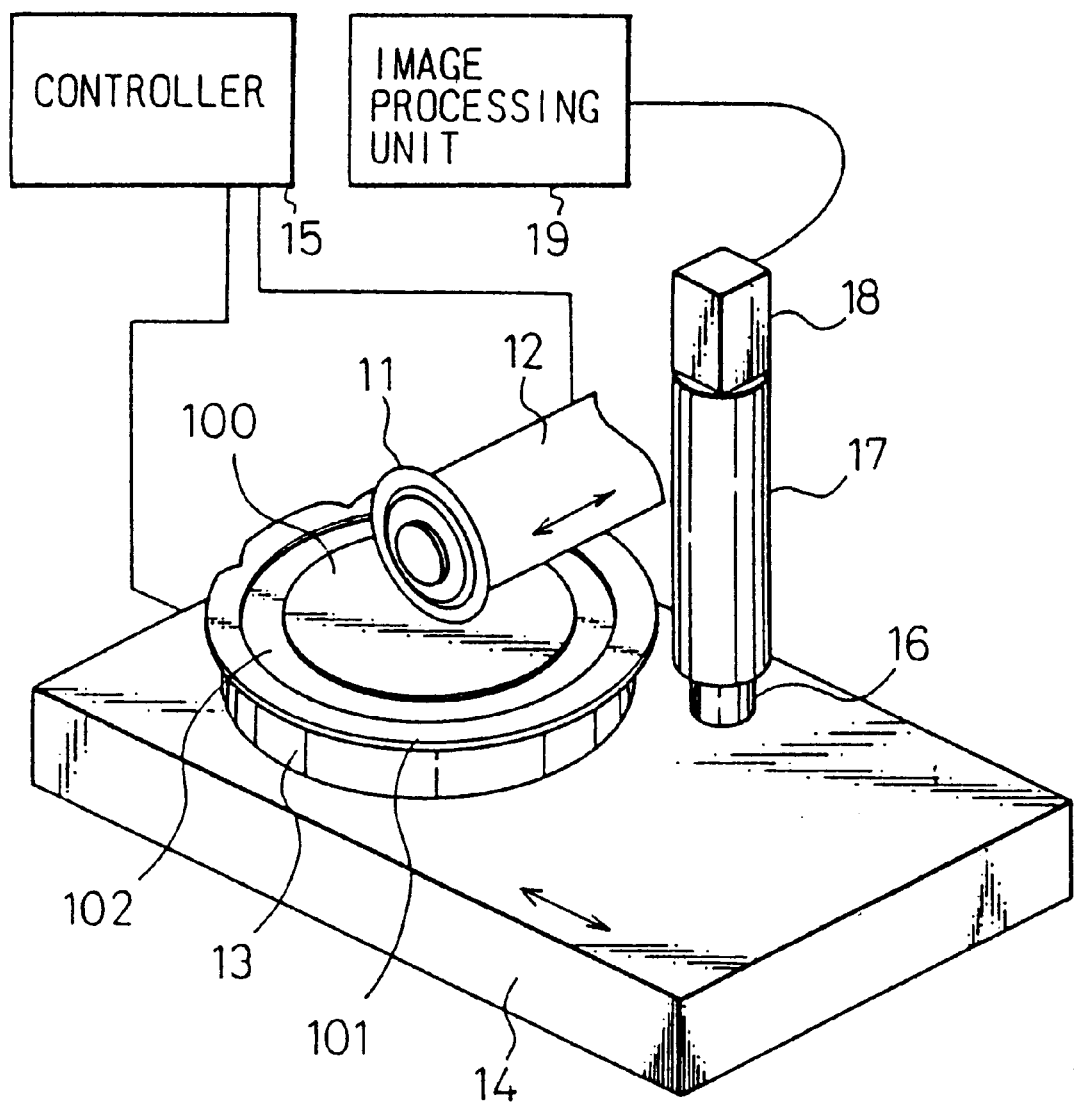
FIG. 1 is a perspective view showing a fundamental constitution of a dicing apparatus.

Before proceeding to a detailed description of the preferred embodiments of the present invention, prior art shape-recognizing apparatuses will be described, with reference to the accompanying drawings relating thereto, for a clearer understanding of the differences between the prior art and the present invention. In the accompanying drawings, like or corresponding functional parts are denoted by the same reference characters and repetitive descriptions thereof will be omitted.

FIG. 1 is a perspective view showing a fundamental constitution of a dicing apparatus. In FIG. 1, reference 100 indicates a semiconductor wafer to be diced; 11 indicates a cutting blade formed by bonding abrasive grains of diamond or the like with nickel or the like; 12 indicates a spindle motor holding the cutting blade 11 to rotate the cutting blade 11 at a high speed; 13 indicates a stage for fixedly supporting the semiconductor wafer 100 thereon by suction; 14 indicates a precision stage moving mechanism for moving the stage in the directions of the arrows, and 16, 17 and 18 indicate components including in an image pickup device for measuring the position of the semiconductor wafer 100 supported on the stage 13. The stage 13 supporting the semiconductor wafer 100 is moved relative to the rotating cutting blade 11 for dicing.

Although the semiconductor wafer 100 may directly be held on the stage 13, it is usual to attach an adhesive sheet onto rear surface of the semiconductor wafer 100 and to fix the adhesive sheet onto the stage 13 to prevent the semiconductor wafer 100 from breaking into pieces during dicing. When thus holding the semiconductor wafer 100 on the stage 13, as shown on FIG. 1, an adhesive sheet 102 is attached to a frame 101 having a central opening, for example formed by punching, the semiconductor wafer 100 is attached to the adhesive surface of the adhesive sheet 102 exposed in the central opening of the frame 101, and the frame 101 thus holding the semiconductor wafer 100 is fixedly mounted on the stage 13. The frame 101 thus holding the semiconductor wafer 100 is transported between processing stations.

The image pickup device comprises an objective 16 which forms an enlarged image of the surface of the semiconductor wafer 100, a lens barrel 17 and a video camera 18. The image pickup device provides video signals representing an enlarged image of the surface of the semiconductor wafer 100. As previously described, the pattern of the semiconductor chips fabricated on the surface of the semiconductor wafer 100 cannot be correctly positioned relative to the working position of the cutting blade 11 by simply mounting the semiconductor wafer 100 on the stage 13 and hence the alignment operation is performed. In the alignment operation, the position of the semiconductor wafer 100 relative to the working position of the cutting blade 11 is adjusted by moving the stage 13 supporting the semiconductor wafer 100 into the field of view of the image pickup device and aligning a specified position on the semiconductor wafer 100 with a specified position in the field of view of an image pickup device.

The image pickup device is located beforehand at a predetermined position relative to the working position of the cutting blade 11.

After determining the positional relationship between the specified position on the surface of the semiconductor wafer 100 and the working position of the cutting blade 11, the stage 13 is moved by the precision stage moving mechanism 14 to accurately cut grooves at desired locations on the semiconductor wafer 100. This positioning operation described above is called an alignment operation.

The alignment operation is carried out by an operator watching a monitor screen displaying of images picked up by a video camera 18. Recently, automation of the dicing apparatus has been desired to enhance productivity and automation of the alignment operation has been realized. Automation of the alignment operation can be achieved by image processing the video signals provided by the video camera 18.

FIG. 2 is a plan view of a semiconductor wafer showing pattern recognition positions for automatic alignment. FIG. 2 indicates a state of a semiconductor wafer 100 held on an adhesive sheet 102 attached to a frame 101 which is about to be diced on a dicing apparatus. As shown in FIG. 2, a plurality of semiconductor chips 110 are fabricated on the semiconductor wafer 100 in a predetermined arrangement, and grooves are to be cut between the rows and lines of the semiconductor chips 110. When carrying out automatic alignment through image processing, points A to E are brought into the field of view of the video camera 18, and the boundaries between the lines and the rows of the semiconductor chips 110 are detected. Then, the inclination and the position of the lines and rows of the semiconductor chips 110 are determined on the basis of the results of the detection, the stage 13 is turned so that the lines and rows of the semiconductor chips 110 are aligned with the axes of the moving mechanism, and the coordinates of the moving mechanism, in a state where the specified position on the semiconductor wafer 100 coincides with a specified position on the image formed by the video camera 18, are stored in a memory. The identification of the lines and the rows of the semiconductor chips 110 using the points A to E can be achieved by a known pattern matching method or the like. Accordingly, when the points A to E are brought into the field of view of the video camera 18 for identification, the identification of the lines and the rows of the semiconductor chips 110 requires a comparatively short time if the points A to E are positioned near the center of the field of view of the video camera 18. However, if the points A to E are located far from the center of the field of view of the video camera 18, the automatic alignment operation requires a comparatively long time because the operation for pattern matching must be repeated many times.

The semiconductor wafer has a circular or substantially circular shape. Therefore, the points A to E shown in FIG. 2 are moved, during the automatic alignment operation, into the field of view of the video camera 18 on an assumption that the semiconductor wafer 100 is circular, the semiconductor wafer 100 is supported on the frame 101 with its center substantially on the center of the frame 101, and the direction of extension of the lines of the semiconductor chips 110 is within a certain range relative to notches formed in the frame 101. The pattern matching operation is performed after the semiconductor wafer 100 has been thus positioned. In the industrial manufacturing process, some semiconductor wafers are cracked or chipped, and the semiconductor wafer is not always supported on the frame with its center in coincidence with the center of the frame.

Figure 3A:
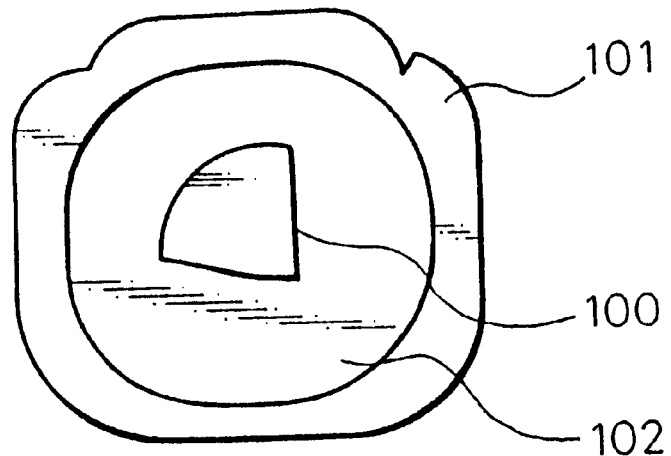
FIG. 3A is a plan view showing a cracked semiconductor wafer having an abnormal shape.
Figure 3B:
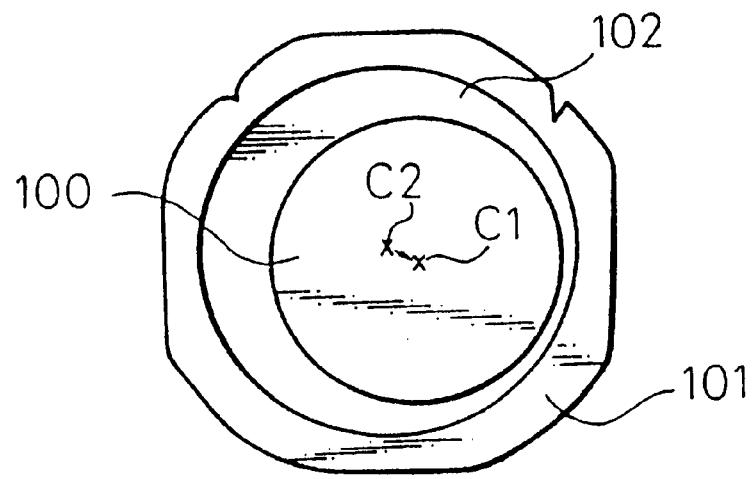
FIG. 3B is a plan view showing a chipped semiconductor wafer supported on a frame but laid at an incorrect position relative to the frame.

FIG. 3A is a plan view showing a cracked semiconductor wafer having an abnormal shape, and FIG. 3B is a plan view showing a chipped semiconductor wafer supported on a frame laid at an incorrect position relative to the frame.

FIGS. 3A and 3B show a semiconductor wafer having an abnormal shape and a semiconductor wafer not correctly supported on the frame, respectively. The yield rate of the process will be reduced if cracked semiconductor wafers and chipped semiconductor wafers are thrown away. Therefore, defective, such as cracked or chipped, semiconductor wafers must be diced to provide normal semiconductor chips in order to increase the yield rate. A semiconductor wafer 100 shown in FIG. 3A must also be diced. However, when adjusting the position of the cracked semiconductor wafer 100 shown in FIG. 3A, by an automatic alignment operation, the automatic identification of the lines and rows of the semiconductor chips is impossible because the positions for identifying the lines and rows of the semiconductor chips can not be determined, and part of the semiconductor wafer 100 not provided with lines and rows of semiconductor chips is brought into the field of view. When the center C1 of the semiconductor wafer 100 is misplaced greatly from the center C2 of the frame 101 as shown in FIG. 3B, it is again impossible to identify the lines and the rows of the semiconductor chips.

The applicant of the present patent application disclosed a dicing apparatus which starts its operation after recognizing the shape of the semiconductor wafer in Japanese Unexamined Patent Publication (Kokai) No. 4-109652. A dicing apparatus capable of recognizing the shape of the semiconductor wafer by image processing is disclosed in Japanese Unexamined Patent Publication (Kokai) No. 4-233250.

Figure 4:
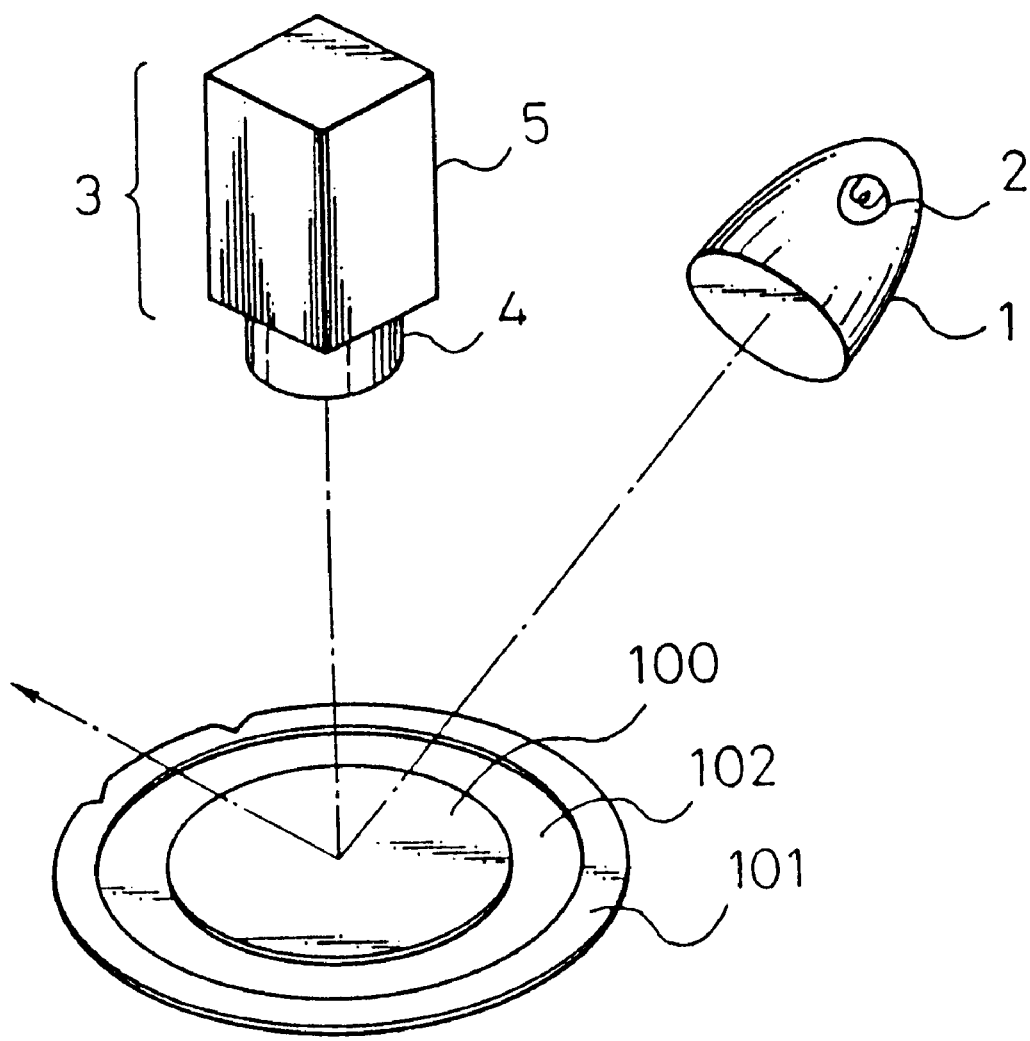
FIG. 4 is a perspective view of a fundamental arrangement where an image of a semiconductor wafer is picked up by a video camera for the purpose of shape recognition.

FIG. 4 is a perspective view of a fundamental arrangement where an image of a semiconductor wafer is picked up by a video camera for the purpose of shape recognition. In FIG. 4, reference 1 indicates an illuminating device having a lamp 2 for illuminating a semiconductor wafer 100, and 3 indicates an image pickup system consisting of a lens unit 4 and a video camera 5. Illuminating light emitted by the illuminating device 1 falls obliquely on the surface of the semiconductor wafer 100, and the image pickup device 3 is directed perpendicularly to the surface of the semiconductor wafer 100 to pick up the image of the semiconductor wafer 100.

Figure 5A:
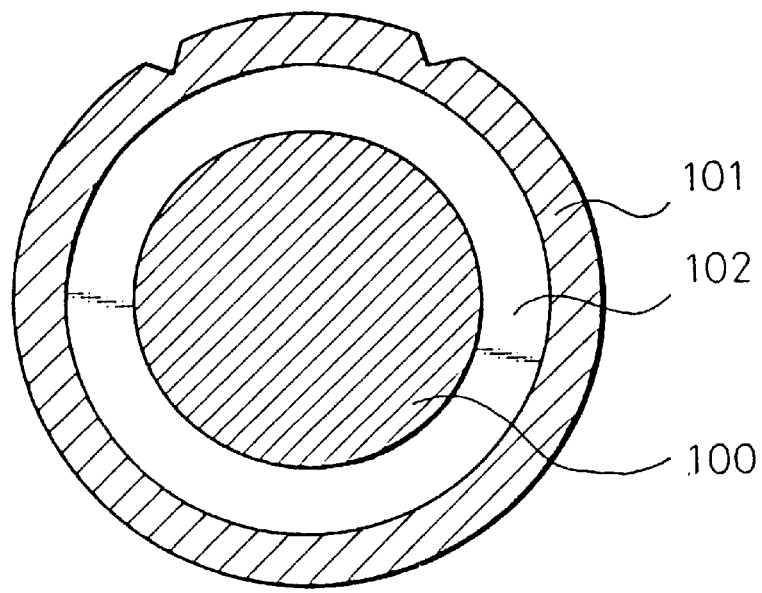
FIG. 5A is a plan view of an image of a standard semiconductor wafer of which image is picked up under the arrangement shown in FIG. 4.
Figure 5B:
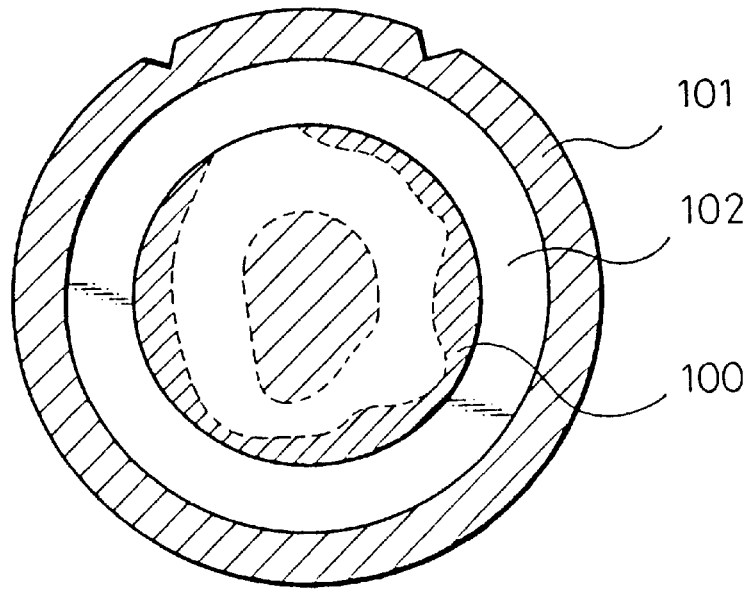
FIG. 5B is a plan view of an image of an abnormal semiconductor wafer of which image is picked up under the arrangement shown in FIG. 4.

FIG. 5A is a plan view of an image of a standard semiconductor wafer which is obtained using the arrangement shown in FIG. 4, and FIG. 5B is a plan view of an image of an abnormal semiconductor wafer which is obtained using the arrangement shown in FIG. 4. The image pickup device 3 is disposed so that the specularly reflected light will not fall thereon. If the semiconductor wafer 100 is in the normal state, the video camera provides video signals representing an image as shown in FIG. 5A. Since the surface of the semiconductor wafer 100 is a highly accurate flat plane, most of the illuminating light falling on the surface of the semiconductor wafer 100 is specularly reflected and little reflected light falls on the image pickup device 3 and hence a region in the image corresponding to the semiconductor wafer 100 is very dark. Although the flatness of the surface of the frame 101 is not as high as that of the surface of the semiconductor wafer 100, a region in the image corresponding to the frame 101 is somewhat dark because the surface of the frame 101 has a comparatively high flatness. Since the surface of the adhesive sheet 102 reflects the illuminating light irregularly, a region in the image corresponding to the surface of the adhesive sheet 102 is bright. Accordingly, when processing the image to recognize the shape of the semiconductor wafer 100, the image is converted into a digital image by converting the brightness values of the image into digital values with reference to an appropriate threshold.

Sometimes, the region in the image corresponding to the surface of the semiconductor wafer is brighter than the region corresponding to the surface of the adhesive sheet when the surface of the semiconductor wafer is in a particular condition. In such a case, the image data is inverted so that the images of bright surfaces are dark and the images of dark surfaces are bright, and then the inverted image data is processed in the foregoing manner to recognize the shape of the semiconductor wafer.

Once the shape of the semiconductor wafer 100 is recognized, the automatic alignment operation becomes possible because the positions for recognizing the lines and the rows of the semiconductor chips can be specified, and the useless machining time can be dispensed with when dicing the semiconductor wafer 100 because unnecessary parts are not cut and only necessary parts of the semiconductor wafer 100 are cut for dicing.

As previously described, according to the prior art shape-recognizing apparatuses, some circuit pattern formed on the surface of the semiconductor wafer 100 interfere with the perfect specular reflection of the incident illuminating light and causes part of the reflected light to fall on the image pickup device 3, which is inferred to be due to the diffraction of the light. If such a phenomenon occurs, there is a problem that the video camera 5 provides video signals representing a partly bright image of the semiconductor wafer as shown in FIG. 5B. Thus, if the image as shown in FIG. 5B is subjected to digitization using the same threshold as that used for digitizing the image as shown in FIG. 5A, the semiconductor wafer 100 is recognized as a cracked semiconductor wafer and an accurate recognition of the shape of the semiconductor wafer 100 is impossible.

In case when the semiconductor wafer is warped or the surface of the semiconductor wafer is not uniform as shown in FIG. 5B, the shape of the semiconductor wafer cannot be accurately recognized.

Moreover, due to the transmission rate depending on the color of the adhesive sheet 102, not all of the illuminating light incident onto the adhesive sheet 102, with the semiconductor wafer 100 thereon, is specularly reflected and some of the incident illumitating light is irregularly reflected from some parts of the adhesive sheet 102 because the stage 13 is painted white, and the irregularly reflected light is received by the image pickup means 3. Therefore, depending upon the transmission rate of the color of the adhesive sheet 102, there is a phenomenon such that the irregular reflection occurs in the area where the transmission rate is high and the image pickup means 3 receives reflected light, while the irregular reflection does not occur in the area where the transmission rate is low and the image pickup means 3 does not receive the reflected light.

Figure 6:
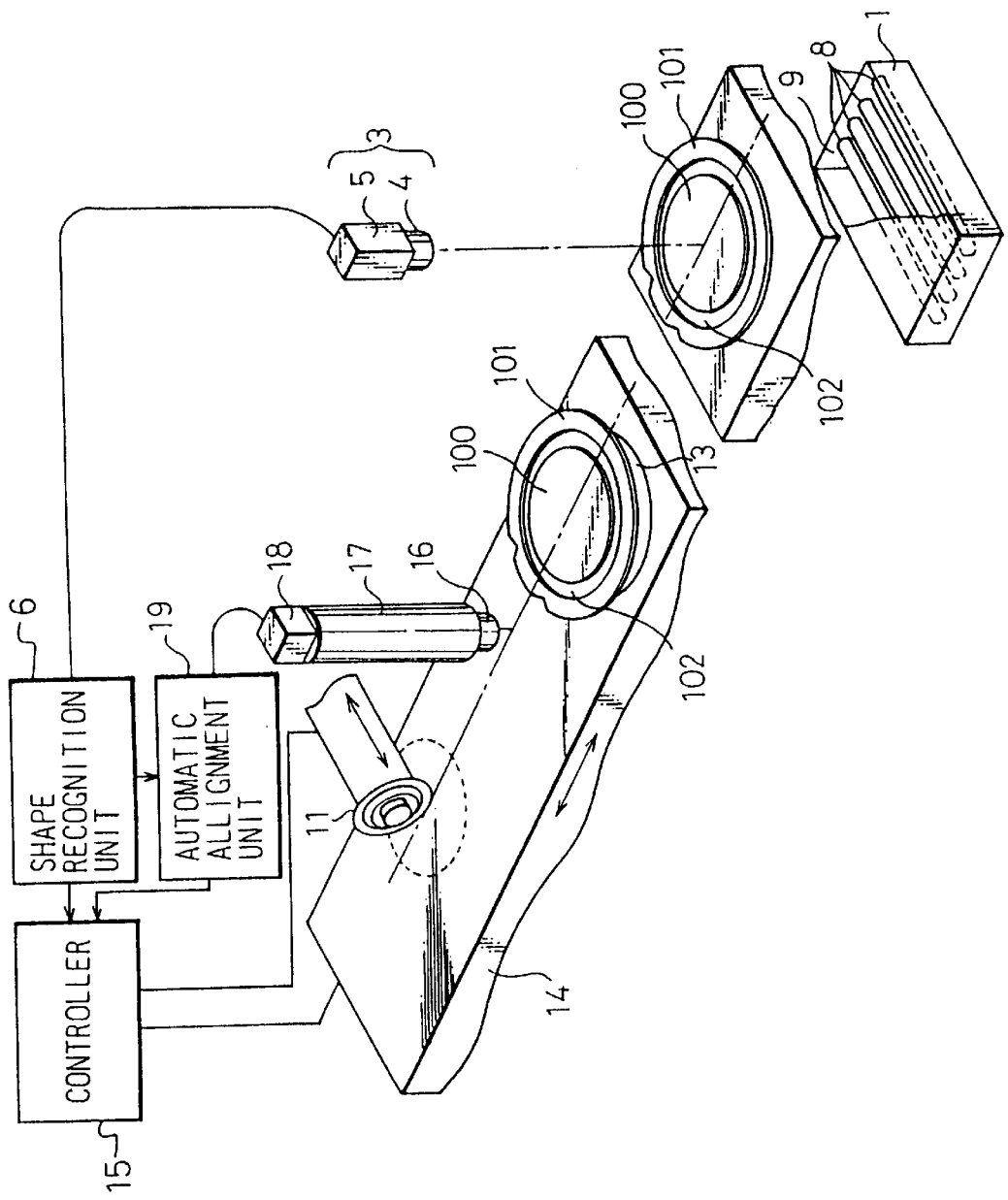
FIG. 6 is a perspective view of a dicing apparatus incorporating a shape recognizing apparatus in a preferred embodiment according to the present invention.

FIG. 6 is a perspective view of a dicing apparatus incorporating a shape recognizing apparatus in a preferred embodiment according to the present invention. In FIG. 6, indicated at 11 is a cutting blade, and at 12 is a spindle motor for rotating the cutting blade 11 at a high rotating speed, capable of being moved in the directions of the arrows. A stage 13 for holding a semiconductor wafer 100 to be subjected to dicing is moved in the directions of the arrows by a stage moving mechanism 14. Moving mechanisms for moving the spindle motor 12 and the stage 13 are controlled by a controller 15. The semiconductor wafer 100 is attached to an adhesive sheet 102 attached to the frame 101 shown in FIG. 2, and the frame 101 holding the semiconductor wafer 100 to be diced is mounted on the stage 13. An image pickup device for forming an image of the semiconductor wafer 100 for the automatic alignment operation comprises a microscope lens unit 16, a lens barrel 17 and a video camera 18. In FIG. 6, an illuminating device is not shown. The microscope lens unit 16 forms enlarged images of the semiconductor wafer 100, the frame 101 and the adhesive sheet 102 on the video camera 18, and then the video camera 18 provides video signals representing the enlarged images. An automatic alignment unit 19 processes the video signals to identify a circuit pattern formed on the semiconductor wafer 100 and calculates the inclination of the circuit pattern relative to the screen and the position of the circuit pattern. The controller 15 turns the stage 13 to bring the lines of semiconductor chips into alignment with the axis of the stage moving mechanism 14 and moves the stage 13 to bring a specified position on the circuit pattern into coincidence with the center of the screen on the basis of calculated values provided by the automatic alignment unit 19. In this state, the controller 15 stores the coordinates of the stage moving mechanism 14 as origin and controls the operation of the stage moving mechanism 14.

The shape recognizing apparatus has elements 1 to 9. Reference numeral 1 indicates an illuminating device for illuminating the semiconductor wafer 100 when picking up an image of the semiconductor wafer 100 for shape recognition. The illuminating device 1 has a plurality of fluorescent lamps 8 and a plate 9 for scattering the light from the lamps 8. Reference numeral 3 indicates an image pickup device, a shape recognizing unit 6 carries out image processing on the basis of video signals provided by the image pickup device 3 to recognize the shape of the semiconductor wafer 100. Apart from the stage moving mechanism 14 to the right side, a pre-alignment stage is provided. A plurality of semiconductor wafers 100, each of which is attached to an adhesive sheet 102 attached to the frame 101 having a central opening, is stored in a cassette (not shown). The semiconductor wafers 100 are automatically delivered and laid, one by one, onto the pre-alignment stage.

Figure 7:
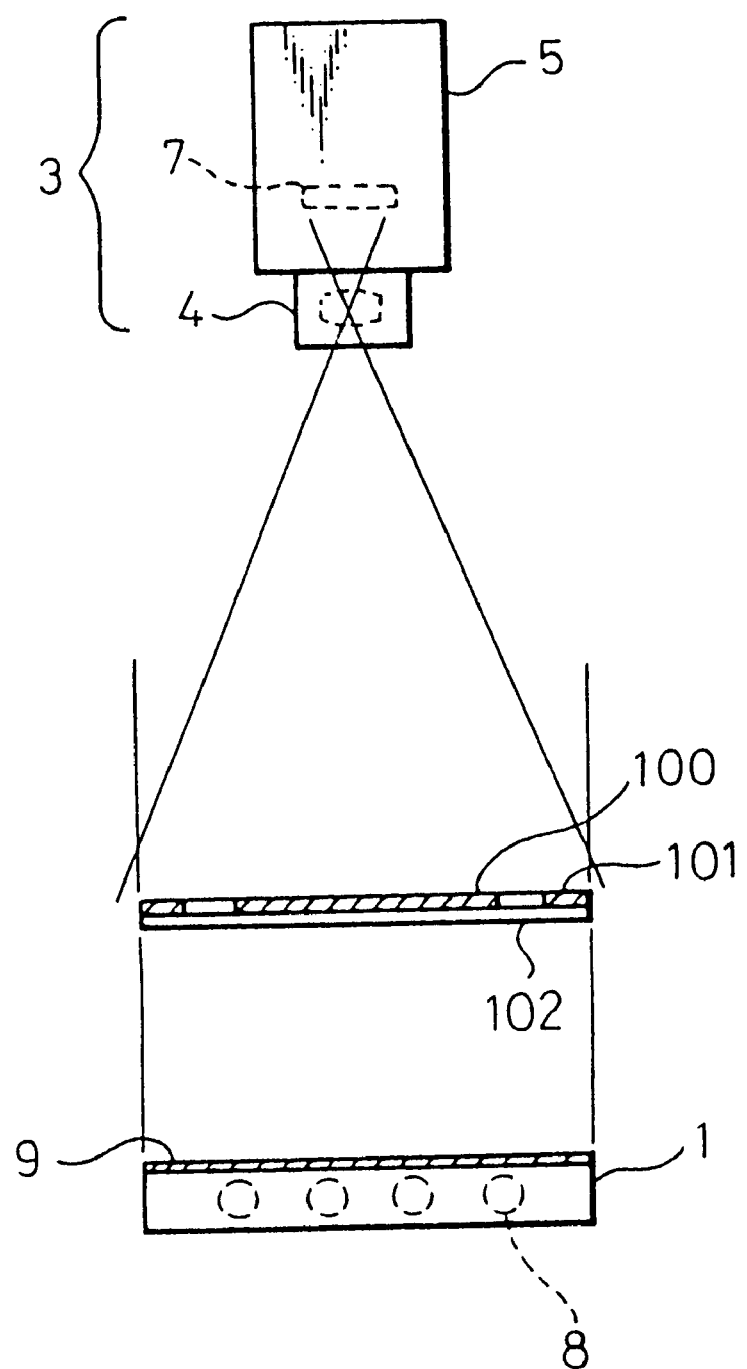
FIG. 7 is a sectional view showing an appearance of the shape recognizing apparatus of an embodiment according to the present invention when an image of a semiconductor wafer is picked up.

FIG. 7 is a sectional view showing an appearance of the shape recognizing apparatus of an embodiment according to the present invention when an image of a semiconductor wafer is picked up. In FIG. 7, reference numeral 4 indicates the objective of the image pickup device 3, and reference numeral 5 indicates a video camera. The semiconductor wafer 100 laid on the above explained pre-alignment stage receives light projected from the illuminating device 1, and an image of the semiconductor wafer 100 is picked up by the image pickup device 3. Namely light from the fluorescent lamps 8 of the illuminating device 1 is projected to the image pickup device 3 through the adhesive sheet 102 with the semiconductor wafer 100. In this case, the projected light from the illuminating device 1 is transmitted where the semiconductor wafer 100 does not exist and the projected light is intercepted where the semiconductor wafer 100 exists. Thus, the shape of the semiconductor wafer 100 is imaged on the surface of a opto-electrical device 7 disposed in the image pickup device 3. Any color of the adhesive sheet 102 used at this time may be available as far as the adhesive sheet 102 can transmit light. Video signals of the image of the semiconductor wafer 100 thus picked up are transmitted from the video camera 5 to the shape recognizing unit 6. The shape recognizing unit 6 executes image processing based on the video signals and recognizes the shape of the semiconductor wafer 100.

The illuminating device 1 used here is preferably a surface emitting type, for example, the device 1 preferably projects light normal to the surface of the scattering plate 9 covering a plurality of fluorescent lamps 8 in the device 1 so as to transmit uniform light to the semiconductor wafer 100, as shown in FIG. 7.

Next, the semiconductor wafer 100 is delivered from the table of the pre-alignment stage onto the stage moving mechanism 14, then the dicing processes by the dicing apparatus proceed. Since the semiconductor wafer 100 is automatically delivered, the position where the semiconductor wafer 100 repeatedly delivered onto the stage moving mechanism 14 from the pre-alignment stage is constant. Thus the semiconductor wafer 100 can be accurately diced in accordance with the previously mentioned alignment operation.

As is apparent from the foregoing description, the shape recognizing apparatus for a semiconductor wafer in accordance with the present invention which is light transmission type, picks up an image of the semiconductor wafer interposed between an illuminating means and an image pickup means. The shape recognizing apparatus can distinguish the shape of the semiconductor wafer regardless the states of the surface of the semiconductor wafer or colors of the adhesive sheet unlike the light reflection type. Namely, the image of the shape of the semiconductor wafer can be clearly picked up because of the contrast due to the fact that the adhesive sheet transmits light while the semiconductor wafer laid on the adhesive sheet does not transmit light. Consequently, stable and accurate shape recognition can be achieved by the shape recognizing apparatus according to the present invention. Moreover, it is not required to adjust the sensitivity of the. optical units with great care, unlike the prior art reflection type apparatus, thus simple operation can be realized.

I claim:

1. A dicing apparatus for dicing a semiconductor wafer, said apparatus comprising:

a stage means for supporting a semiconductor wafer thereupon;

a shape recognizing apparatus for recognizing a shape of the semiconductor wafer, said shape recognizing apparatus including an image pickup means for picking up an image of the semiconductor wafer and for providing video signals representing the image, the image pickup means being disposed at a position opposite to a surface of the semiconductor wafer, a shape recognizing means for recognizing the shape of the semiconductor wafer by processing the video signals, the shape recognizing means also having an illuminating means for illuminating a semiconductor wafer in a manner to transmit light through an adhesive sheet with the semiconductor wafer adhered thereto, the illuminating means being disposed opposite to the image pickup means with the adhesive sheet with the semiconductor adhered thereto being interposed between the illuminating means and the image pickup means, wherein said illuminating means is a surface emitting type comprising a light source and a plate for scattering the light source so as to simultaneously illuminate the entire semiconductor wafer and the surrounding adhesive sheet with uniform light so that an image of the complete semiconductor wafer is received by said image pickup means that receives light transmitted through said adhesive sheet; said dicing apparatus further comprising an alignment means to which the wafer is fed from said shape recognizing apparatus and for adjusting an orientation of said wafer based on the processed video signals;

dicing means for dicing said semiconductor wafer;

control means coupled to said dicing means and said shape recognizing means for controlling said dicing means to dice the semiconductor wafer in accordance with data obtained from the shape recognizing apparatus.

2. A dicing apparatus as recited in claim 1, wherein said adhesive sheet has any color and is attached to a frame having a central opening configured to hold the semiconductor wafer therein.

* * * * *